United States Patent
Chou et al.

(10) Patent No.: US 8,865,526 B2
(45) Date of Patent: *Oct. 21, 2014

(54) SEMICONDUCTOR DEVICE AND METHOD FOR MANUFACTURING A SEMICONDUCTOR DEVICE

(71) Applicant: Vishay General Semiconductor LLC, Hauppauge, NY (US)

(72) Inventors: Ta-Te Chou, Taipei (TW); Yong-Qi Tian, Tianjin (CN); Xian Li, Tianjin (CN)

(73) Assignee: Vishay General Semiconductor LLC, Hauppauge, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 13/859,816

(22) Filed: Apr. 10, 2013

(65) Prior Publication Data

US 2013/0224911 A1  Aug. 29, 2013

Related U.S. Application Data

(62) Division of application No. 11/973,759, filed on Oct. 10, 2007, now Pat. No. 8,421,214.

(51) Int. Cl.
| | |
|---|---|
| *H01L 23/34* | (2006.01) |
| *H01L 23/40* | (2006.01) |
| *H01L 23/495* | (2006.01) |
| *H01L 23/367* | (2006.01) |
| *H01L 23/31* | (2006.01) |

(52) U.S. Cl.
CPC .............. *H01L 23/34* (2013.01); *H01L 23/3107* (2013.01); *H01L 23/4093* (2013.01); *H01L 23/49586* (2013.01); *H01L 23/3672* (2013.01); *H01L 2224/32245* (2013.01)
USPC ............ 438/118; 438/121; 438/117; 438/125; 438/106; 438/123; 438/348; 438/361; 438/112; 438/124; 438/111

(58) Field of Classification Search
CPC ............ H01L 23/5389; H01L 23/3107; H01L 23/4093; H01L 23/49586
USPC ......... 438/118, 121, 117, 125, 106, 123, 348, 438/361, 112, 124, 126, 127, 111
See application file for complete search history.

(56) References Cited

U.S. PATENT DOCUMENTS

| | | |
|---|---|---|
| 4,054,901 A | 10/1977 | Edwards et al. |
| 5,436,407 A | 7/1995 | Fehr et al. |

(Continued)

OTHER PUBLICATIONS

International Rectifier DirectFET, http://www.irf.com/products-info/hexfet/directfet.htm, 2 pages, copyright 1995-2005.

(Continued)

*Primary Examiner* — Chuong A Luu
(74) *Attorney, Agent, or Firm* — Stuart H. Mayer; Karin L. Williams; Mayer & Williams PC

(57) ABSTRACT

A semiconductor device mountable to a substrate is provided. The device includes a semiconductor package having at least one semiconductor die, an electrically conductive attachment region, and a packaging material in which is embedded the semiconductor die and a first portion of the electrically conductive attachment region contacting the die. A metallic shell encloses the embedded semiconductor die and the first portion of the electrically conductive attachment region.

5 Claims, 4 Drawing Sheets

(56) References Cited

U.S. PATENT DOCUMENTS

| | | |
|---|---|---|
| 5,635,754 A | 6/1997 | Strobel et al. |
| 5,880,403 A | 3/1999 | Czajkowski et al. |
| 5,917,157 A | 6/1999 | Remsburg |
| 5,946,556 A | 8/1999 | Hashizume |
| 6,317,326 B1 | 11/2001 | Vogel et al. |
| 6,409,859 B1 | 6/2002 | Chung |
| 6,566,742 B1 | 5/2003 | Matsumoto et al. |
| 6,624,522 B2 | 9/2003 | Standing et al. |
| 6,707,138 B2 | 3/2004 | Crowley et al. |
| 6,784,540 B2 | 8/2004 | Cardwell |
| 6,791,172 B2 | 9/2004 | Chen et al. |
| 7,215,551 B2 | 5/2007 | Wang et al. |
| 7,241,645 B2 | 7/2007 | Zhao et al. |
| 8,198,709 B2 * | 6/2012 | Chou et al. .......... 257/659 |
| 8,586,413 B2 * | 11/2013 | Foong et al. .......... 438/109 |
| 2003/0123240 A1 | 7/2003 | McIlnay et al. |
| 2007/0013053 A1 | 1/2007 | Chou |
| 2008/0036072 A1 | 2/2008 | Chou et al. |
| 2008/0054439 A1 | 3/2008 | Malhan et al. |
| 2008/0164590 A1 * | 7/2008 | Xiaochun et al. .......... 257/675 |
| 2008/0166837 A1 | 7/2008 | Feng et al. |

OTHER PUBLICATIONS

International Rectifier DirectFET MOSFET Packagining, http://www.irf.com/product-info/hexfet/dfpackaging.html, 2 pages, copyright 1995-2005.

* cited by examiner

DECREASED PACKAGE BACKSIDE THICKNESS
HAS MOLDING FAILURE SUCH AS VOID OR IPE

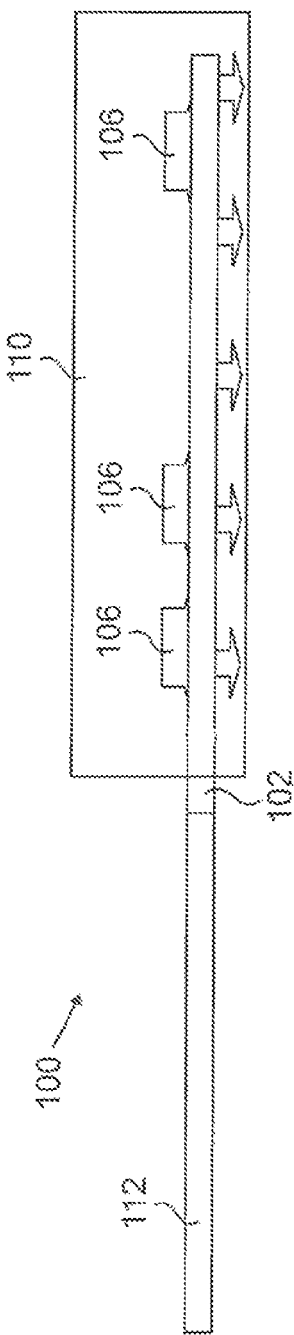
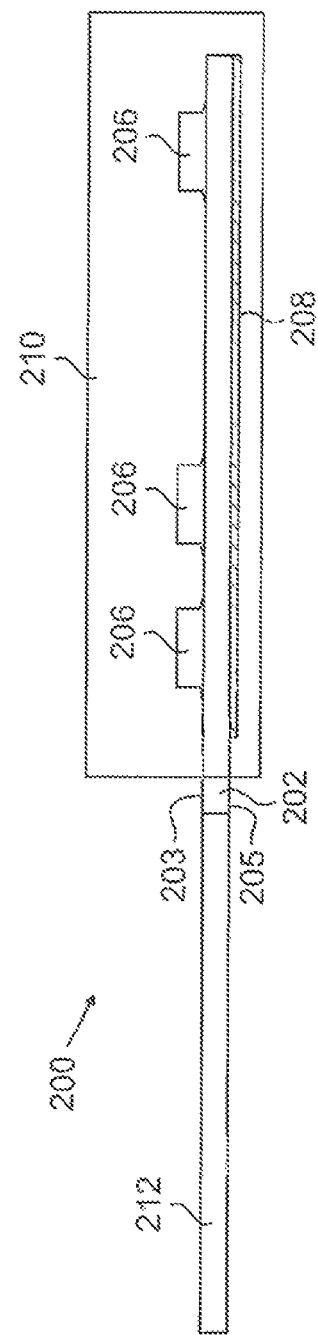

SEMICONDUCTOR DEVICE AND METHOD FOR MANUFACTURING A SEMICONDUCTOR DEVICE

RELATED APPLICATIONS

This application is a divisional of U.S. patent application Ser. No. 11/973,759, filed Oct. 10, 2007 now U.S. Pat. No. 8,421,124 entitled "Semiconductor Device And Method For Manufacturing A Semiconductor Device."

This application is related to U.S. patent application Ser. No. 11/827,041, filed Jul. 9, 2007, entitled "Semiconductor Device and Method for Manufacturing a Semiconductor Device", which claims the benefit of U.S. Provisional Patent Application Ser. No. 60/837,329, filed Aug. 11, 2006, entitled "Method of Fabricating Power Bridge by Coating Lead Frame with High Dielectric Strength and High Thermal Conductivity Material".

This application is also related to U.S. patent application Ser. No. 11/827,042, filed Jul. 9, 2007, entitled "Semiconductor Device and Method for Manufacturing a Semiconductor Device Having Improved Heat Dissipation Capabilities", which claims the benefit of U.S. Provisional Patent Application Ser. No. 60/837,353, filed Aug. 11, 2006, entitled "Method For Assembling Metal Heat Sink Onto Semiconductor Device."

This application is also related to U.S. patent application Ser. No. 11/179,334, filed Jul. 12, 2005, entitled "Semiconductor Device and Method for Manufacturing a Semiconductor Device".

Each of the applications identified above are incorporated herein by reference in their entirety.

FIELD OF THE INVENTION

Aspects of this invention relate generally to a semiconductor device and to a method for manufacturing a semiconductor device, and more particularly to a semiconductor device encapsulated in a housing having a reduced thickness.

BACKGROUND OF THE INVENTION

A major cause of reduced efficiency in semiconductor devices such as rectifiers is inadequate cooling during normal operation. FIGS. 1 and 2 are perspective and cross-sectional views of a Vishay® Semiconductor brand single phase inline bridge rectifier device 100 having multiple semiconductor dies 106 inside, manufactured by Vishay Intertechnology, Inc. Device 100 is through-hole mountable via leads 112, and includes an exterior epoxy housing 110 that protects the semiconductor dies—during operation of device 100, heat generated by the semiconductor dies is transferred through leads 112 and housing 110. The thermal conductivity of epoxy housing 110 often results in device 100 having poor thermal dissipation performance.

FIG. 3 shows the manner is heat is dissipated in the rectifier device 100 shown in FIGS. 1 and 2. The thermal dissipation route is indicated by the arrows. As shown, the primary heat path extends from the back side of the leads through the epoxy housing 110. In this device the heat dissipation is inhibited by the thickness and low thermal conductivity of the epoxy housing 110. Unfortunately, if the thickness of the housing is reduced to achieve better thermal conduction, molding failures such as IPE or voids 130 (see FIG. 2) tend to increase, leading to problems such as a failure of a high-potential (hipot) test or electric strength test, which is caused by a breakdown in insulation.

Semiconductor device package designs that incorporate additional cooling features have been proposed. International Rectifier Corporation, for example, has created a surface-mountable metal oxide semiconductor field effect transistor ("MOSFET") chip set referred to as DirectFET™. Certain DirectFET™ devices have a copper can construction, which is advertised to enable dual-side cooling. U.S. Pat. No. 6,624,522 (the "'522 Patent") and U.S. Pat. No. 6,784,540 (the "'540 Patent") describe certain aspects of the construction and/or manufacture of surface-mountable semiconductor devices such as DirectFET™ devices. While these devices address the problem of dissipating heat generated by a power semiconductor device, they do so at the expense of an increase in cost, complexity and/or the overall size of the resulting device.

SUMMARY OF THE INVENTION

In accordance with the present invention, a semiconductor device mountable to a substrate is provided. The device includes a semiconductor package having at least one semiconductor die, an electrically conductive attachment region, and a packaging material in which is embedded the semiconductor die and a first portion of the electrically conductive attachment region contacting the die. A metallic shell encloses the embedded semiconductor die and the first portion of the electrically conductive attachment region.

In accordance with one aspect of the invention, a thermally conductive adhesive layer may be located between the metallic shell and the semiconductor package for securing the metallic shell to the semiconductor package.

In accordance with another aspect of the invention, the metallic shell may comprise aluminum.

In accordance with another aspect of the invention, the metallic shell may be configured as an aluminum clip.

In accordance with another aspect of the invention, the conductive adhesive layer may be a cured silicone layer.

In accordance with another aspect of the invention, the packaging material may comprise a molding compound.

In accordance with another aspect of the invention, the semiconductor package may further comprise a dielectric, thermally conductive epoxy located between the packaging material and the first portion of the electrically conductive attachment region.

In accordance with another aspect of the invention, the semiconductor device may comprise a power semiconductor device.

In accordance with another aspect of the invention, the power semiconductor device may comprises a rectifier.

In accordance with another aspect of the invention, the rectifier may comprise a bridge rectifier.

In accordance with another aspect of the invention, the semiconductor device may comprise a surface-mountable device.

In accordance with another aspect of the invention, the semiconductor device may comprise a through-hole-mountable device.

In accordance with another aspect of the invention, the semiconductor device may comprise a chip-scale package.

In accordance with another aspect of the invention, the electrically conductive attachment region may comprise one of a copper pad, a solder ball, a lead, a lead frame, and a lead frame terminal.

BRIEF DESCRIPTION OF THE DRAWINGS

FIG. 3 is another cross-sectional view of the packaging for a through-hole mountable semiconductor device shown in FIGS. 1 and 2 illustrating the primary path for heat dissipation.

FIG. 4 is a cross-sectional view of a through-hole mountable semiconductor package that may be employed in the present invention.

DETAILED DESCRIPTION

Figure 1:
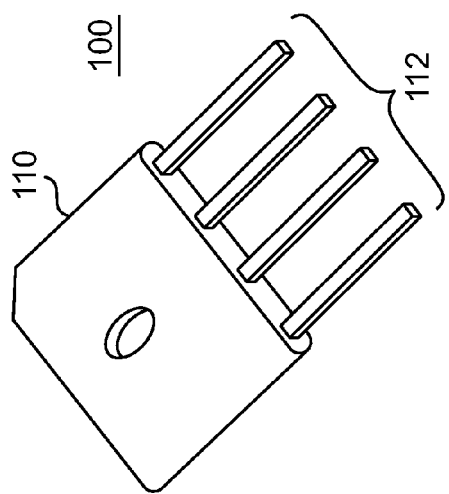
FIGS. 1 and 2 are perspective and cross-sectional views, respectively, of the packaging for a conventional through-hole mountable semiconductor device.
Figure 2:
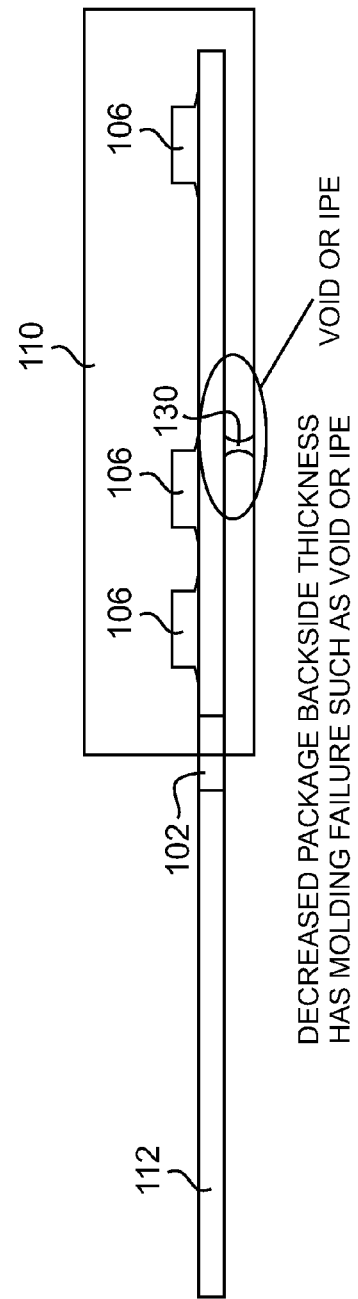

FIG. 4 is a side view of an interior cross-section of a through-hole mountable semiconductor package 200 in accordance with certain aspects of the present invention. For exemplary purposes, semiconductor package 200 has a similar footprint and die arrangement as through-hole mountable semiconductor device 100 (shown in FIG. 1), although package 200 may have different exterior dimensions or geometries altogether. Semiconductor package 200 may be a power semiconductor device, such as a rectifier or another type of integrated circuit. It should be noted that package 200 is just one example of a semiconductor package to which the present invention may be applied. More generally, the present invention is applicable to any semiconductor package 200 that needs to be further overmolded or encapsulated.

Electrically conductive attachment regions 202, such as a copper pads, solder balls, leads, lead frames, or lead frame terminals, each have one surface 203 arranged to provide electrical communication with a semiconductor die 206 (three die are visible, although only one die is referenced for exemplary purposes.) Die 206 may be, for example, a diode, a MOSFET, or another type of die/integrated circuit. Surface 203 may be attached to die 206 in any suitable manner, such as by soldering using, for example, a solder paste dot and a copper clip. To facilitate the soldering process a solder bump may be pre-applied to one side of the die. Through-hole mountable leads 212 (one visible) may also be in electrical communication with semiconductor die 206 and/or electrically conductive attachment region 202.

Another surface 205 of electrically conductive attachment region 202 is coated with an interlayer material 208 such as an epoxy that has a high dielectric constant and a high thermal conductivity. The material 208 may be a commercially available thermally conductive adhesive such as SE4486 and SE4450 manufactured by DOW CORNING, 282 manufactured by Emerson & Cuming, and SA2000 manufactured by BERGQUIST.

Package 200 also includes a molding compound 210 that encloses die 206 and electrically conductive attachment regions 202. The molding compound 210 may be a plastic material molded to thermally conductive element 202 and/or interlayer material 208. Molding compound may be formed in any desired configuration/shape by a variety of well-known methods, such as overmolding or injection molding.

By using interlayer material 208 the thickness of the package 200 can be advantageously reduced while still avoiding deleterious effects caused to the semiconductor device 200 by IPE (Internal Parts Exposure) or voids. In some cases the package 200 thickness can be reduced by 50% or more. For instance, the package 200 may be reduced from 1.0 mm to 0.5 mm in thickness. In particular, the semiconductor device package 200 can avoid hipot test failures even with such a reduction in housing thickness. The interlayer material 208 effectively acts as a shield providing a high dielectric strength during a hipot test while also allowing good thermal conduction because of its high thermal conductivity.

Figure 5:
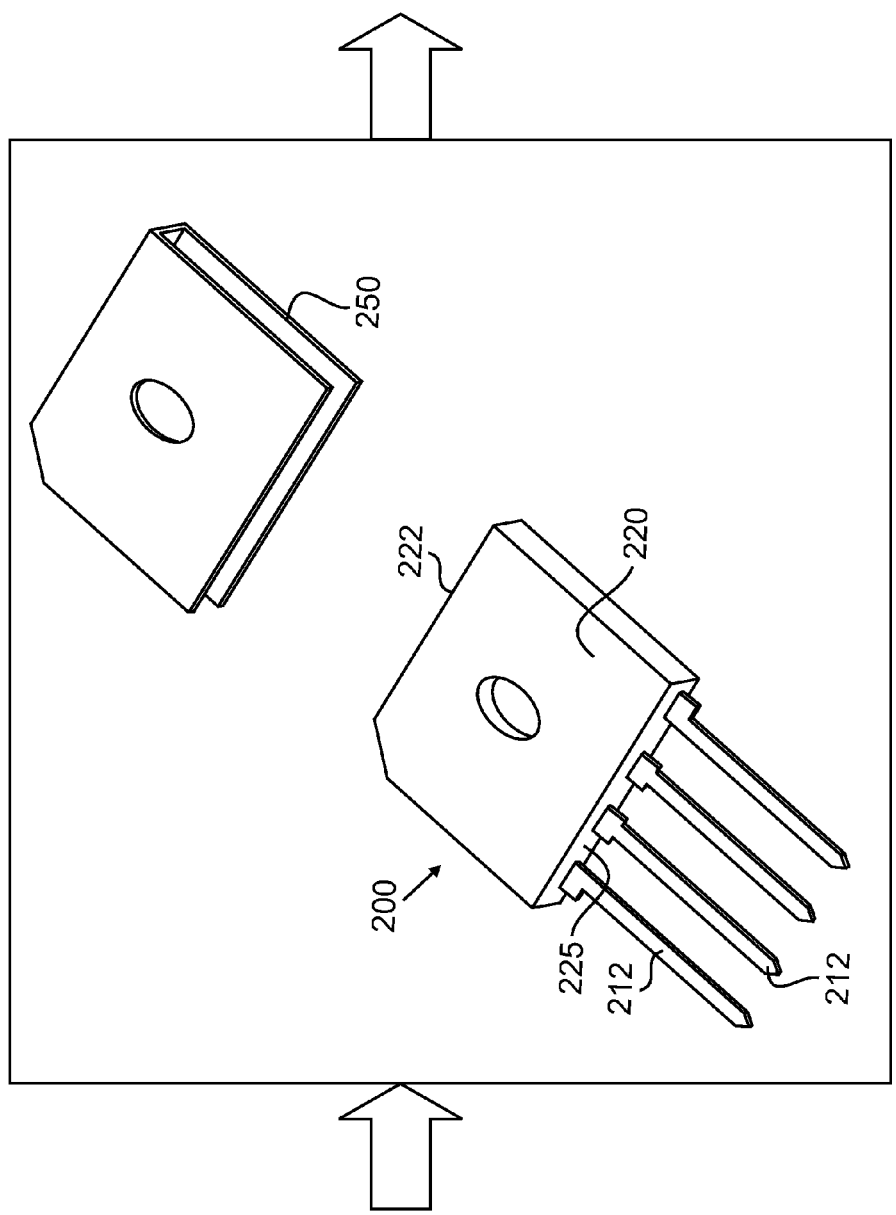
FIG. 5 shows a perspective view of the semiconductor package shown in FIG. 4 along with the metallic shell that is applied over the semiconductor package to form the semiconductor device constructed in accordance with the present invention.

To further facilitate thermal dissipation and to provide mechanical protection for the package 200 during handling and the like, an outer metallic shell is provided over and around package 200. One example of such a metallic shell is shown as metallic shell 250 in FIG. 5. In this particular example the shell 250 is configured as a clip that slides over the semiconductor package 200. Once in place the metallic clip 250 contacts three outer surfaces of the package 200: the two largest surfaces that oppose one another, one of which is visible in FIG. 5 as surface 220, and the third of which is the transverse surface 222 that opposes the surface 225 through which the leads 212 extend. The metallic shell 250 may be formed from aluminum or other suitable material. Aluminum is particularly advantageous because of its low cost and weight and its good thermal conductivity. In addition, aluminum is a relatively easy material to process from a manufacturing perspective. OF course, a wide variety of other metals (e.g., copper) and metal alloys may be used.

The thermal contact resistance between the metallic shell 250 and the semiconductor package 200 can be reduced by applying a high performance, highly thermally conductive silicone epoxy to fill the gap between the two components. Examples of such silicone materials includes the aforementioned SE4486 and SE4450 manufactured by DOW CORNING as well as SA1000 and Appleton manufactured by BERGQUIST. The silicone epoxy can be applied to the outer surfaces of the semiconductor package 200 prior to sliding the metallic clip 250 over the package 200. After the metallic clip 250 has been put in place the silicone is cured under elevated temperatures and pressure as appropriate. In this way the metallic clip 250 is securely and attached to the package 200 in a fixed manner.

Figure 6:
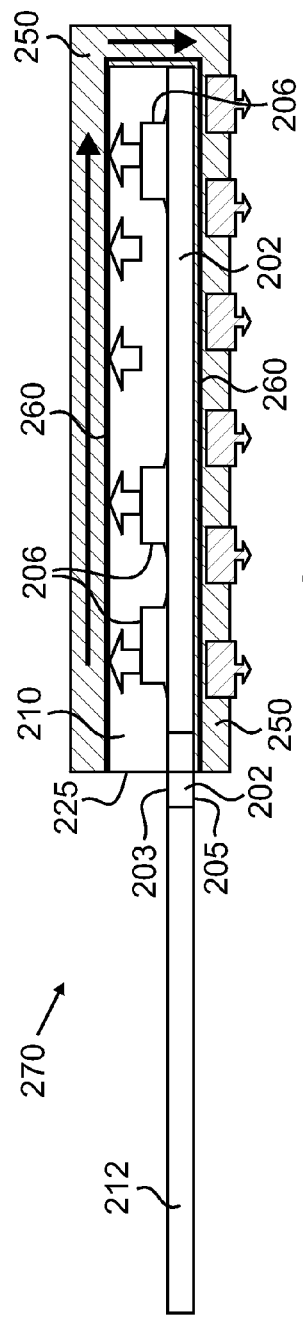
FIG. 6 is a cross-sectional view of the semiconductor device constructed in accordance with the present invention, which illustrates the dual-sided paths for heat dissipation.

FIG. 6 shows a cross-sectional view of the completed semiconductor device 270 in which the silicone layer 260 is applied to the outer surfaces of the molding compound 210 of the semiconductor package 200. The metallic clip 250 encloses the package 200 and contacts the silicone layer 260. FIG. 6 also shows the manner in which heat is dissipated in the rectifier device 270. The thermal dissipation route is indicated by the arrows. As shown, the heat paths extend from both sides of the electrically conductive attachment region 202 through the molding compound 210. The heat is then dissipated by the conductive silicone layer 260 and the metallic clip 250. In comparison to the thermal dissipation route in the conventional semiconductor device shown in FIG. 3, the semiconductor device 270 can more effectively remove heat generated by the dies 206. That is, in the semiconductor device shown in FIG. 3 the heat is primarily dissipated through only a single side of the device, whereas in the semiconductor device 270 heat is dissipated through both sides of the device. By increasing the thermal performance of the semiconductor device its current rating can be increased, which is an important parameter associated with power devices.

Thus semiconductor devices have been described that include enhanced heat removal paths created by reducing the thickness of the package that encapsulates the die or dies and enclosing the package in a metallic shell. Conducting heat away from mounting substrates is desirable in product designs that feature increased component densities, and thus increased heat flux densities, on each substrate—cooling provided for the substrate, which generally results in a single operating temperature being provided for a relatively large surface area, is supplemented by the electrically isolated semiconductor device package itself. Semiconductor devices may operate at more desirable temperatures without significant alterations in their footprints, and/or without additional isolation requirements, reducing the need for product re-designs.

Aspects of the present invention described above with respect to through-hole mountable semiconductor devices are also applicable to surface-mountable semiconductor devices.

Figure 7:
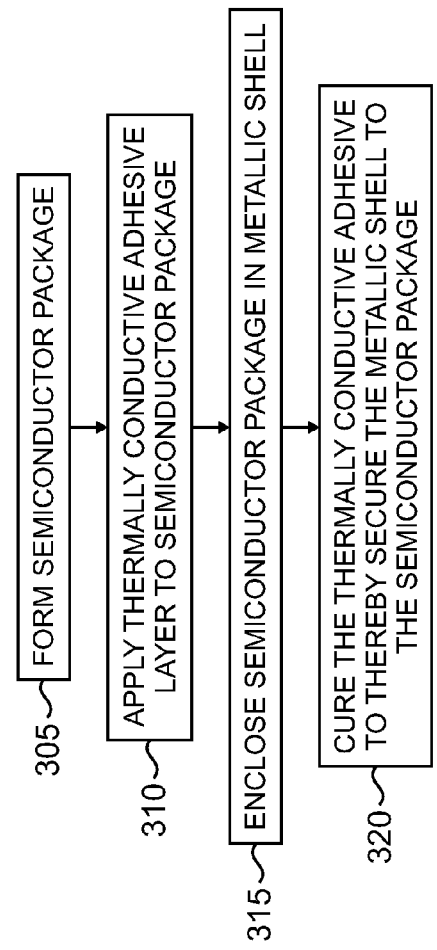
FIG. 7 is a flowchart of a method for fabricating a semiconductor device in accordance with aspects of the present invention.

FIG. 7 is a flowchart for manufacturing a semiconductor device mountable to a substrate. The method begins at step 305 when a semiconductor package is formed by: (i) arranging a semiconductor die for electrical communication with a first attachment area of an electrically conductive attachment region; (ii) applying a dielectric, thermally conductive interlayer material to a second attachment area of the electrically conductive attachment region; and (iii) providing a housing that at least in part encloses the die and the interface material. The method continues at step 310 when a thermally conductive adhesive layer such as silicone is applied to the semiconductor package. Next, in step 315, the semiconductor package is enclosed in a metallic shell such as an aluminum clip that is slid in place in over the semiconductor package. Finally, the thermally conductive adhesive layer is cured under appropriate conditions to thereby secure the metallic shell to the semiconductor package.

It will be apparent that other and further forms of the aspects of the present invention described herein may be devised without departing from the spirit and scope of the appended claims, and it will be understood that aspects of this invention are not to be limited to the specific embodiments described above.

The invention claimed is:

1. A method of manufacturing a semiconductor device mountable to a substrate, the method comprising:
    forming a semiconductor package by:
        arranging a semiconductor die for electrical communication with a first attachment area of an electrically conductive attachment region;
        applying a dielectric, thermally conductive interlayer material to a second attachment area of the electrically conductive attachment region wherein the electrically conductive attachment region is located between the semiconductor die and the dielectric, thermally conductive interlayer material;
    providing a housing at least in part enclosing the die and the interlayer material;
    applying a thermally conductive adhesive layer to the semiconductor package; and enclosing the semiconductor package in a metallic shell,
        wherein the thermally conductive adhesive layer is applied to the semiconductor package prior to enclosing the semiconductor package in the metallic shell.

2. The method of manufacturing the semiconductor device according to claim 1, further comprising curing the thermally conductive adhesive layer to thereby secure the metallic shell to the semiconductor package.

3. The method of manufacturing the semiconductor device according to claim 1, wherein the metallic shell comprises aluminum.

4. The method of manufacturing the semiconductor device according to claim 1, wherein the metallic shell is an aluminum clip.

5. The method of manufacturing the semiconductor device according to claim 1, wherein the thermally conductive adhesive layer is a cured silicone layer.

* * * * *